(12) United States Patent
Schmidt et al.

(10) Patent No.: US 7,515,429 B1
(45) Date of Patent: Apr. 7, 2009

(54) RETRACTABLE OPERATOR CONTROL PANEL WITH UNIVERSAL HINGE DESIGN AND DUAL ORIENTATION FEATURES

(75) Inventors: Derek Ian Schmidt, Raleigh, NC (US); Richard M. Barina, Sebring, FL (US); James Scott Wombie, Hillsborough, NC (US); Daniel Paul Kelaher, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/045,989

(22) Filed: Mar. 11, 2008

(51) Int. Cl.
*H05K 7/20* (2006.01)

(52) U.S. Cl. .................. 361/727; 361/724; 248/917; 248/923

(58) Field of Classification Search ......... 361/679–686, 361/724–727; 312/223.1, 223.2; 248/917–923
See application file for complete search history.

(56) References Cited

U.S. PATENT DOCUMENTS

| | | | |
|---|---|---|---|
| 5,173,686 A * | 12/1992 | Fujihara | 345/87 |
| 5,589,849 A | 12/1996 | Ditzik | |
| 6,115,086 A * | 9/2000 | Rosen | 348/837 |
| 6,144,549 A | 11/2000 | Moss et al. | |
| 6,185,092 B1 | 2/2001 | Landrum et al. | |
| 6,201,690 B1 | 3/2001 | Moore et al. | |
| 6,556,438 B1 | 4/2003 | Bolognia et al. | |
| 6,636,426 B2 * | 10/2003 | Inman | 361/724 |
| 6,721,179 B2 * | 4/2004 | Song et al. | 361/690 |
| 6,741,474 B1 * | 5/2004 | Hung et al. | 361/727 |
| 6,778,381 B1 | 8/2004 | Bolognia et al. | |
| 6,816,177 B2 * | 11/2004 | Wang et al. | 345/156 |
| 6,886,896 B2 * | 5/2005 | Hedrick et al. | 312/223.1 |
| 2005/0225217 A1 * | 10/2005 | Nay et al. | 312/208.1 |
| 2007/0247792 A1 * | 10/2007 | Yang | 361/681 |

* cited by examiner

*Primary Examiner*—Jayprakash N Gandhi
*Assistant Examiner*—Anthony Q Edwards
(74) *Attorney, Agent, or Firm*—Patent Analysis Research Technology Systems LLC; George L. Walton

(57) ABSTRACT

An information control panel and hinge member is removably joined together as a single unit to a retractable shuttle device utilized with computer servers or processor-based devices. The shuttle device having a first central opening with plural spaced apart detent grooves positioned thereabout. The hinge member includes a second central opening with plural spaced apart tabs positioned thereabout. A screw fastening element positioned through the first and second openings to directly and rotatably secure the hinge member relative to the shuttle device. A latch release means permits the single unit to be easily positioned in plural horizontal and vertical orientation positions that moves between selective ranges of 0 degrees to 90 degrees as the tabs moves relative to the detent grooves. Also, at least a stop member is located on the hinge member adjacent one of the tabs to stop the single unit at the minimum and extreme orientation positions.

1 Claim, 8 Drawing Sheets

RETRACTABLE OPERATOR CONTROL PANEL WITH UNIVERSAL HINGE DESIGN AND DUAL ORIENTATION FEATURES

BACKGROUND OF THE INVENTION

1. Field of the Invention

The present invention relates to operator information control panels that are in cooperation with retractable display modules utilized with computer servers and other types of processor-based devices.

2. Description of the Related Art

It is well known that many of the information control panel systems utilized on computer server systems are designed to minimize front panel real estate to maximize airflow across hot internal components of computer server systems or processor-based electronic devices, such as memory modules and microprocessors. In order to maximize this airflow, a common design point is a sliding or retracting tray or rack that provides information (via LEDs, LCD screens or other similar methods) on the internal top face of the sliding or retracting tray or rack. These operator panels are typically designed for either horizontal or vertical orientation, but not both. Current mounting mechanisms for the operator control panels are unidirectional in their rotation once the panels are slid out of the front of the server systems or processor-based devices.

According to one aspect of the prior art, an information display module may be a LCD module moveable between a retracted, space-conserving position and an open, visible or extended position, within a processor-based device. The information display module may be pivoted about a pivot structure from its open position to a position generally perpendicular to the front of the processor-based device. In addition, the information display module may be resiliently biased between its retracted or storage position and open or extended display position by spring means cooperatively associated with the pivot structure.

U.S. Pat. No. 6,778,381 of Bolognia et al discloses a retractable display module system for use with a processor-based device, such as a server. This system teaches a retractable module that may comprise an LCD module that is movable between a retracted position within the server and a pivoted open position that is extended outward of the server to a front of thereof.

Also, many prior art server systems or processor-based devices size and overall package size have been reduced to conserve physical space requirements. Because of size and space, it has become difficult to provide numerous features at the front portion of servers and processor-based devices. Often, it is necessary to provide a display screen, such as LEDs or LCD screens that can provide an operator with a variety of information about the operation of the systems or processor-based devices or the internal components therein. It is well know to those of ordinary skill in the art that conventional displays require substantial space at the front of the server systems or processor-based devices. Therefore, it is important to have displays that can be removed or retracted to a space-conserving location when not being used.

SUMMARY OF THE INVENTION

The present invention includes an universal intermediate hinge or connector member that is disposed between an operator information panel and a sliding shuttle device or tray for holding or securing them together as a single unit, while allowing the single unit to be retractably or slidably mounted in a server system or processor-based device and rotated to both horizontal and vertical orientations. This hinge or connector member allows the operator information panel to be selectively rotated such that the text or information on the top face of the panel can be read upright. The intermediate hinge member defines a central axis that allows the operator information panel and the hinge member to be selectively rotated as a single unit relative to the retractable and sliding tray or shuttle device to permit different information or text viewing positions.

One embodiment of the invention comprises an operator information panel and a universal hinge member connected together as a single unit to a slidable shuttle device mounted for use with a processor-based device, such as a server system. The device comprises a shuttle device slidable between retracted and extended display positions from within a server system, the shuttle device with a central hub portion with first opening therein, a universal hinge member with a central intermediate portion with a second opening therein, the central hub portion with at least a pair of plural selective detent grooves thereon, the universal hinge member with at least a pair of spaced apart tabs above and below the second opening, at least a stop member, outwardly of and adjacent to the at least one of the pair of spaced apart tabs, a shoulder screw member with a head portion and a cone-shaped washer disposed thereon and below the head portion, being inserted the screw member through the first and second openings with an end portion opposite the head portion for receiving a retaining member for securing the shuttle device to the hinge member and information panel unit, the hinge member is disposed narallel and substantially alone the entire length of a surface of the shuttle device in a horizontal orientation position, and a realeasable latch means disposed between the universal hinge member and the shuttle device. wherein the hinge member and the information panel is able to be rotated as single unit relative to the shuttle device to selective plural horizontal and vertical positions along a central rotational axis about the first and second openings. the releasing of the locking means allows the at least a pair of spaced apart tabs to be selective rotated alona the at least a pair of plural selective detent arooves to orient a top face of the information panel to be able to be viewed in both the horizontal and the vertical positions as the single unit is rotated about the rotational axis relative to shuttle device, and the selective horizontal and vertical positions extend within a range between 0 degrees and 90 degrees due to the selective rotational position of the stop member.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION

Reference will now be made in detail to the preferred embodiments of the invention, examples of which are illustrated in the accompanying drawings. While the invention will be described in conjunction with the accompanying drawings, it will be understood that they are not intended to limit the invention to drawings. On the contrary, the present invention is intended to cover alternatives, modifications and equivalents, which may be included within the spirit and scope of the invention as defined by the appended claims.

Figure 1:
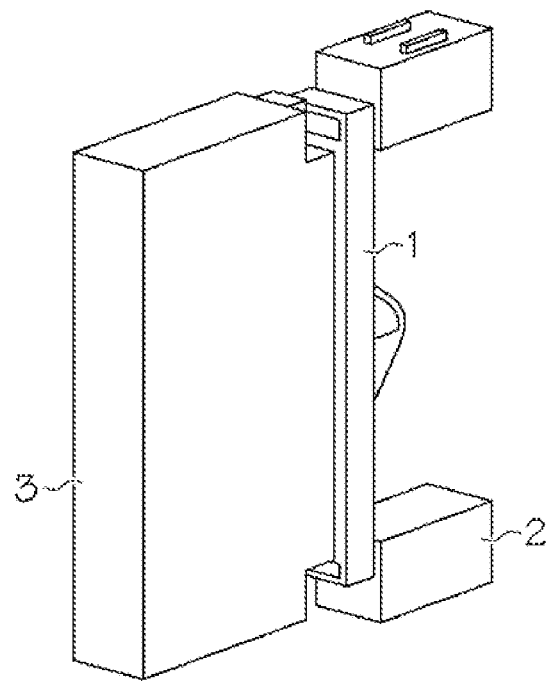
FIG. 1 is a perspective view of the retractable operator information panel and universal hinge unit coupled to a shuttle device according to a first embodiment of the present invention.

FIG. 1 is a perspective view of a retractable operator control or information panel with a universal hinge member and dual orientation features design assembly. In this embodiment, a plurality of densely packaged, processor-based devices (not shown) is typically mounted in a rack or server system (not shown). The rack or server system is designed to slidably receive a plurality of the processor-based devices. These processor-based devices are typically mounted on retractable rails that permit the processor-based devices to be moved between a retracted position within the rack or server system and an extended position that is at least partially extended from the rack or server system. Note that the movement between the retracted and extending positions allows for easy removal or servicing of the individual processor-based devices, as well as, being able to selectively orient the information panel and hinge member as a unit to horizontal and vertical viewing positions.

The assembly as illustrated in FIG. 1 includes a universal hinge member 1, a shuttle or retractable tray device 2, and a control or information panel 3. The hinge member, the shuttle device and the control or information panel are secured together to allow the hinge member and information panel to be rotated relative to the shuttle device.

Figure 2:
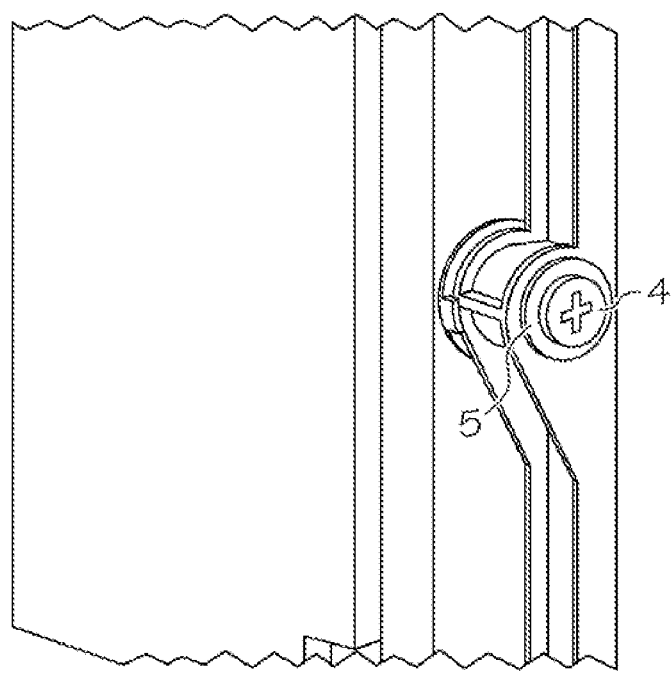
FIG. 2 is a sectional view of the retractable operator information panel and universal hinge unit coupled to a shuttle device according to the first embodiment of the present invention.

FIG. 2 is a sectional view of the retractable operator information panel and hinge unit fastened or secured to a shuttle device by a shoulder screw 4 and a cone-shaped washer 5. The cone-shaped washer 5 is disposed between a head of the screw and a top surface of the hub portion 8a of the shuttle device for holding the shuttle device and hinge member together.

Figure 3:
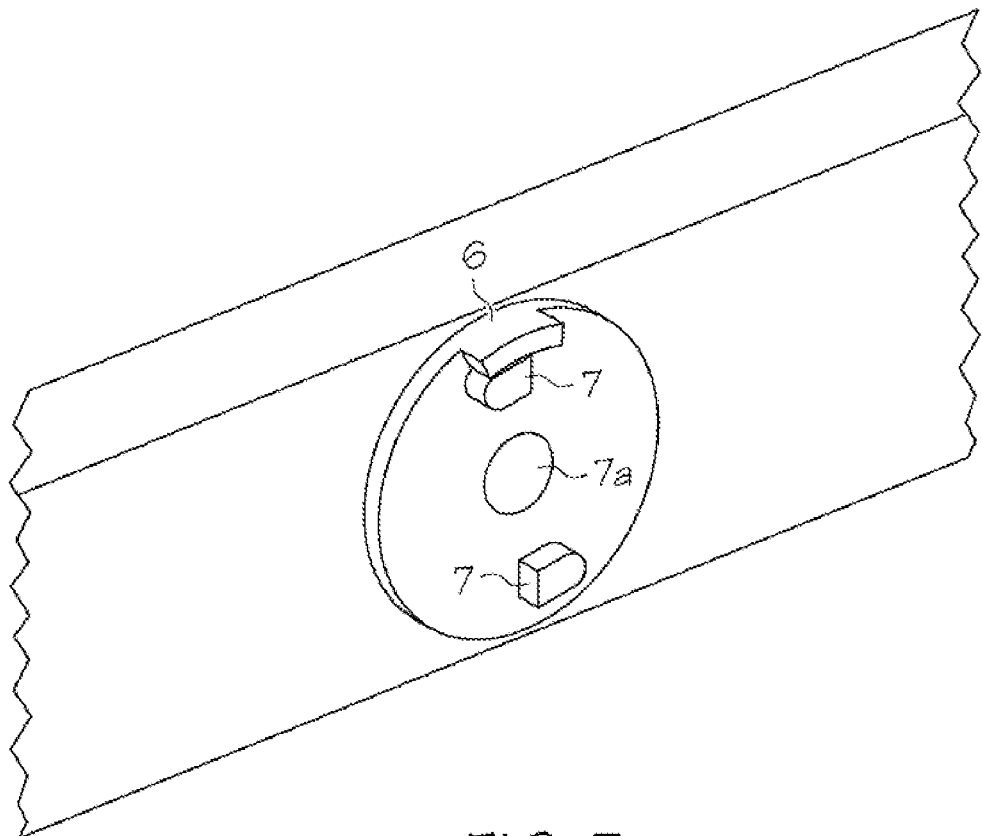
FIG. 3 illustrates a sectional view of the dual orientation selection features of the universal hinge member according to the first embodiment of the present invention.

FIG. 3 illustrates a sectional view of the dual orientation selection features. The dual orientation selection features include a stop element 6 and at least a pair of orientation selection tabs 7. The stop element 6 and the tabs 7 are disposed about a central portion of the hinge member. This central portion defines a first central opening 7a that receives the shoulder screw there through. The tabs 7 are positioned opposite one another, with one tab 7 located above the central opening 7a and the other tab 7 located below the central opening 7a. The stop element 6 is positioned adjacent and above one of the tabs 7. This central portion of the hinge member abuts or engages a bottom section of the hub portion 8a of the shuttle device.

Figure 4:
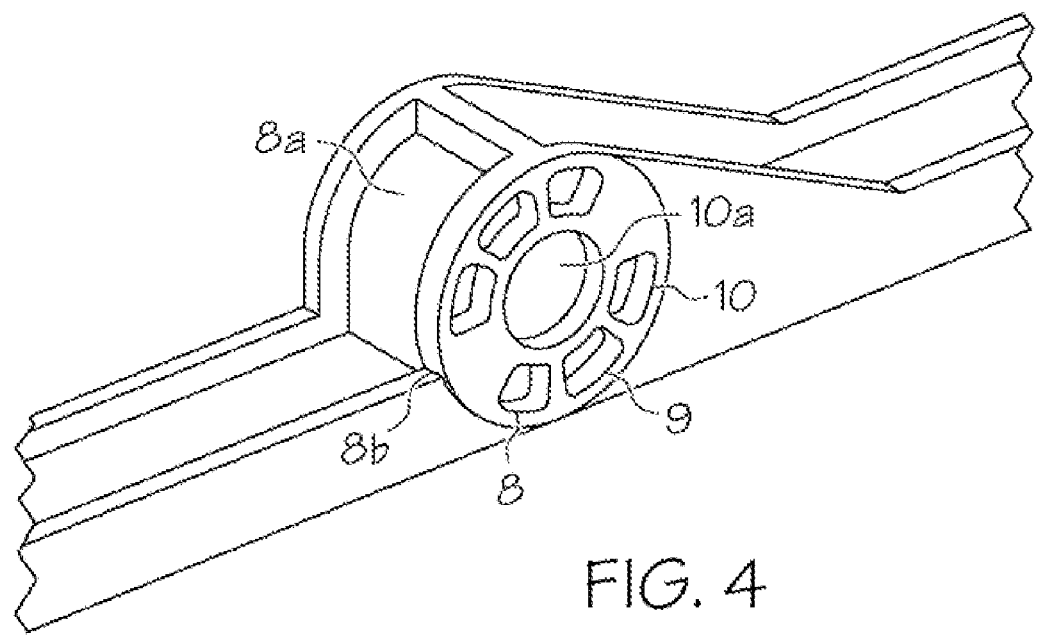
FIG. 4 illustrates a partial view of the shuttle device hub portion with a first type of detent feature according to the first embodiment of the present invention.

FIG. 4 illustrates a partial view of the shuttle device hub portion with a first type of detent feature of the first embodiment. This first type of detent feature includes a pair of at least three separate but adjacent detent grooves 8-10. The detent grooves 8-10 are positioned above and below a second central opening 10a of the hub portion 8a. The first and second openings 7a, 10a are aligned with one another to receive the shoulder screw 4 there through to allow the shuttle device 2 and the hinge member 1 to be fastened or secured together, while allowing the control or information panel 3 and hinge member 1 to be rotated as a unit relative to the shuttle device 2. The central openings 7a, 10a define a central rotational axis.

Figure 5:
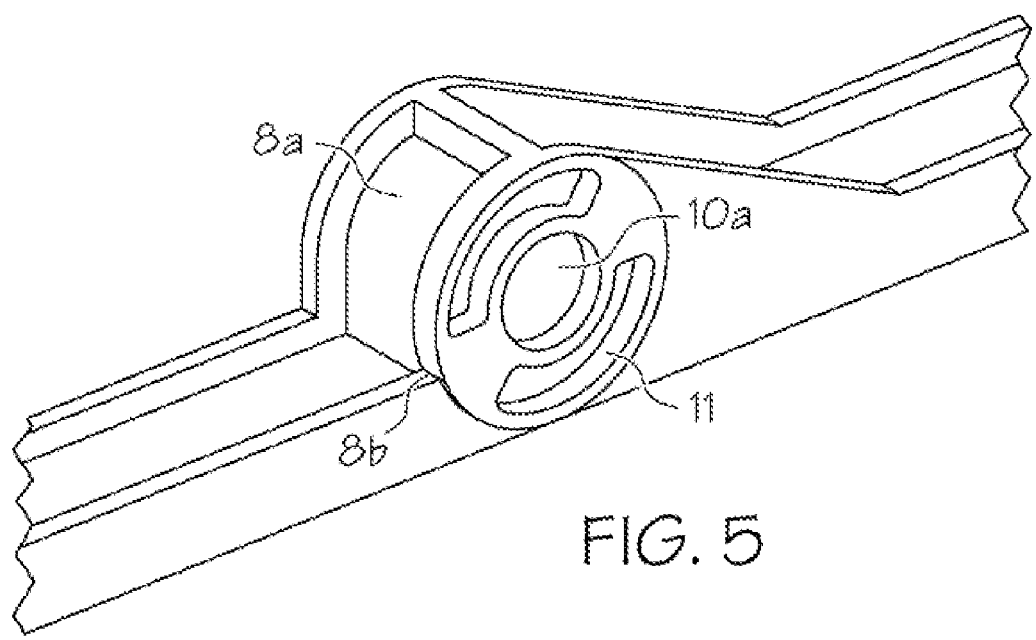
FIG. 5 illustrates a partial view of the shuttle device hub portion with a second type of detent feature according to a second embodiment of the preferred invention.

FIG. 5 illustrates a partial view of the shuttle device hub portion 8a with a second type of detent feature of the second embodiment of the preferred invention. This second type of detent feature includes a pair of at least two separate and spaced apart semi-circular detent grooves 11. The detent grooves 11 are positioned above and below the second central opening 10a of the hub portion 8a. The first and second openings 7a, 10a are aligned with one another to receive the shoulder screw 4 there through to allow the shuttle device 2 and the hinge member 3 to be fastened or secured together, while allowing the control or information panel 3 and hinge member 1 to be rotated as a unit relative to the shuttle device 2 about the central rotational axis.

Figure 6:
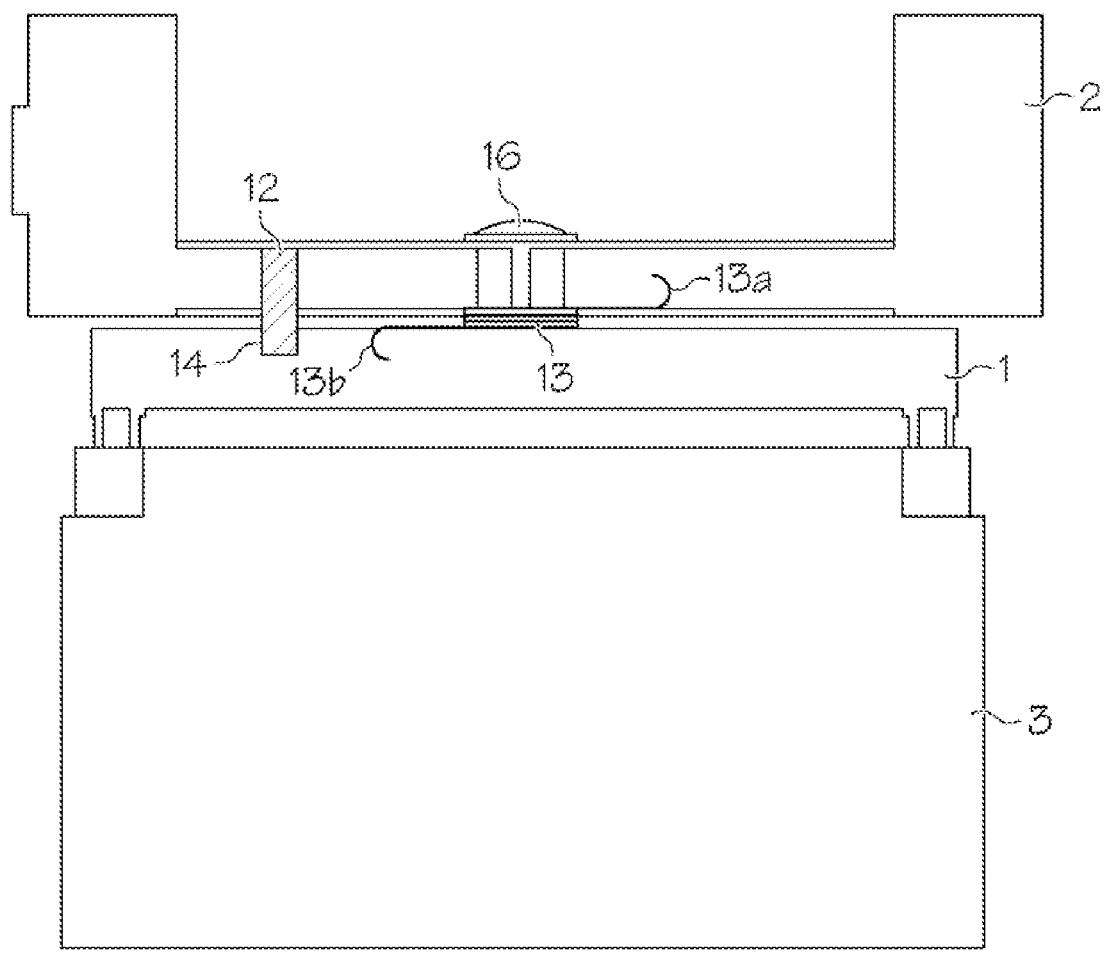
FIG. 6 is a top view of a preferred embodiment of the retractable operator information panel and universal hinge member coupled to a shuttle device with an orientation latch position according to the preferred invention.

FIG. 6 is a top view of the preferred embodiment of the retractable operator information panel 3 and universal hinge member 1 coupled to a shuttle device 2 with an orientation latch position according to the preferred invention. This embodiment is a second manual orientation selection method that utilizes a moveable latch or switch 12 and a rotational coil spring 13 to orient the information panel 3 in the correct text viewing positions. The rotational coil spring 13 having an intermediate portion 13a that is cooperatively secured about the hub portion 8a of the shuttle device or retractable tray, with one end 13b cooperatively secured to another portion of the shuttle device 2, with the other end cooperatively secured to a portion of the intermediate hinge member 1. Note that the coil spring 13 could be fixedly or removeably secured to the hinge member 1 and the shuttle device 2. Preferably, the coil spring 13 is removeably secured to the hinge member 1 and the shuttle device 2. As depicted in FIG. 6, the moveable latch or switch 12 have a first end that is pivoted or rotatably secured to the shuttle device 2 and a second end being received within a slot or channel 14 in a latched position. This latched position illustrates the information panel 3 and the hinge member 1 being latched as a unit in a horizontal orientation relative to shuttle device 2 in a retracted or extended position within the aforementioned rack or server system. Note that this horizontal orientation positions the latched information panel 3 and the hinge member 1 unit along a parallel surface of the shuttle device 2, and substantially along its entire length. It is clear to one of ordinary skill in the art, at the time the invention was made, that the latch or switch 12 and the slot or channel 14 can take on other types of configurations, such as, a camming device, a spring catch device, a snap type device, or a friction type catch device.

Figure 7:
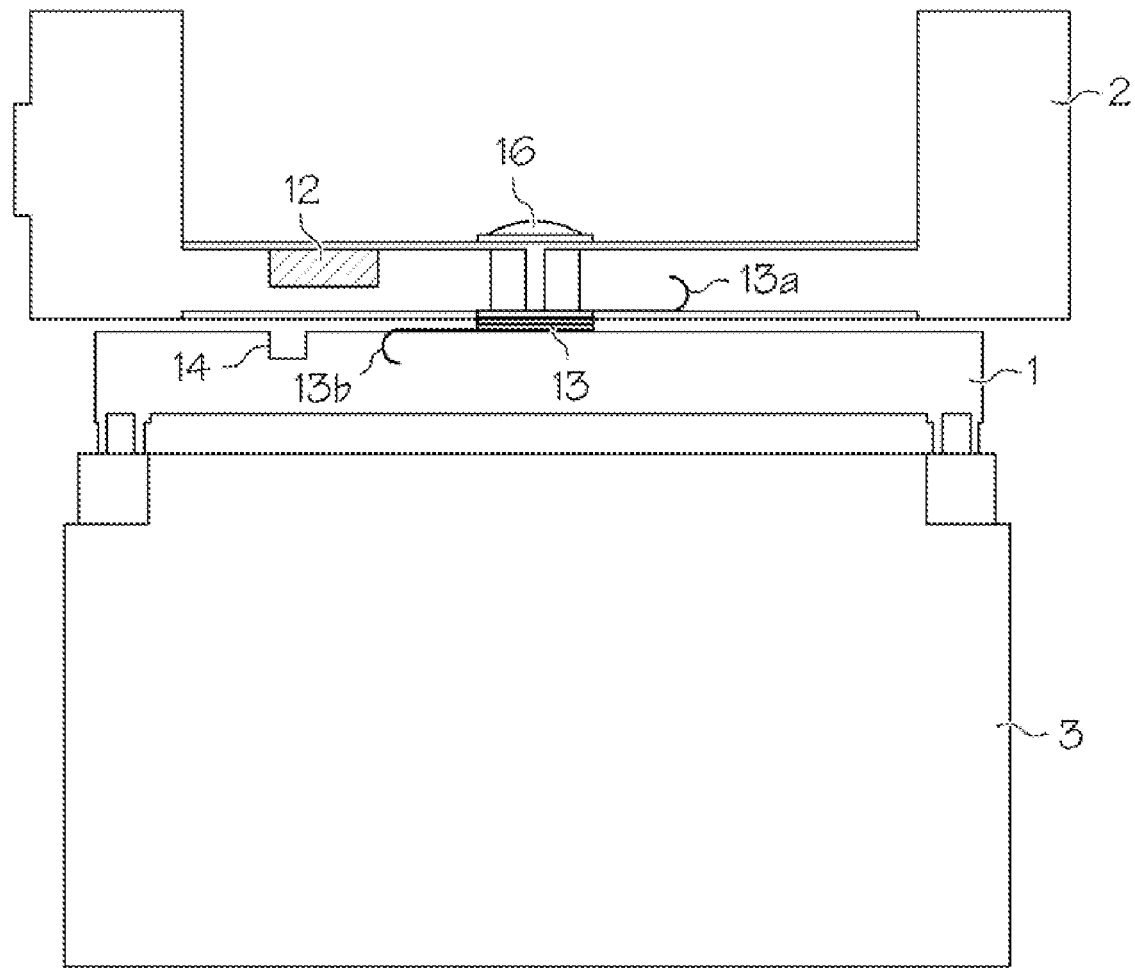
FIG. 7 is a top view of the preferred embodiment of the retractable operator information panel and universal hinge member coupled to a shuttle device with an orientation unlatch position according to the preferred invention.

FIG. 7 is also a top view of the preferred embodiment of the retractable operator information panel 3 and universal hinge member 1 coupled to a shuttle device 2 with an orientation unlatch latch position according to the preferred invention. In this embodiment, the latch or switch 12 is shown in an unlatched position. The second end has been pivoted or rotated out of the slot or notch 14. This allows the compression of the spring 12 to be released and the information panel 3 and the hinge member 1 to be rotated as a unit relative to the shuttle device 2 about the central axis of the shuttle device 2 and the hinge member 1.

Figure 8:
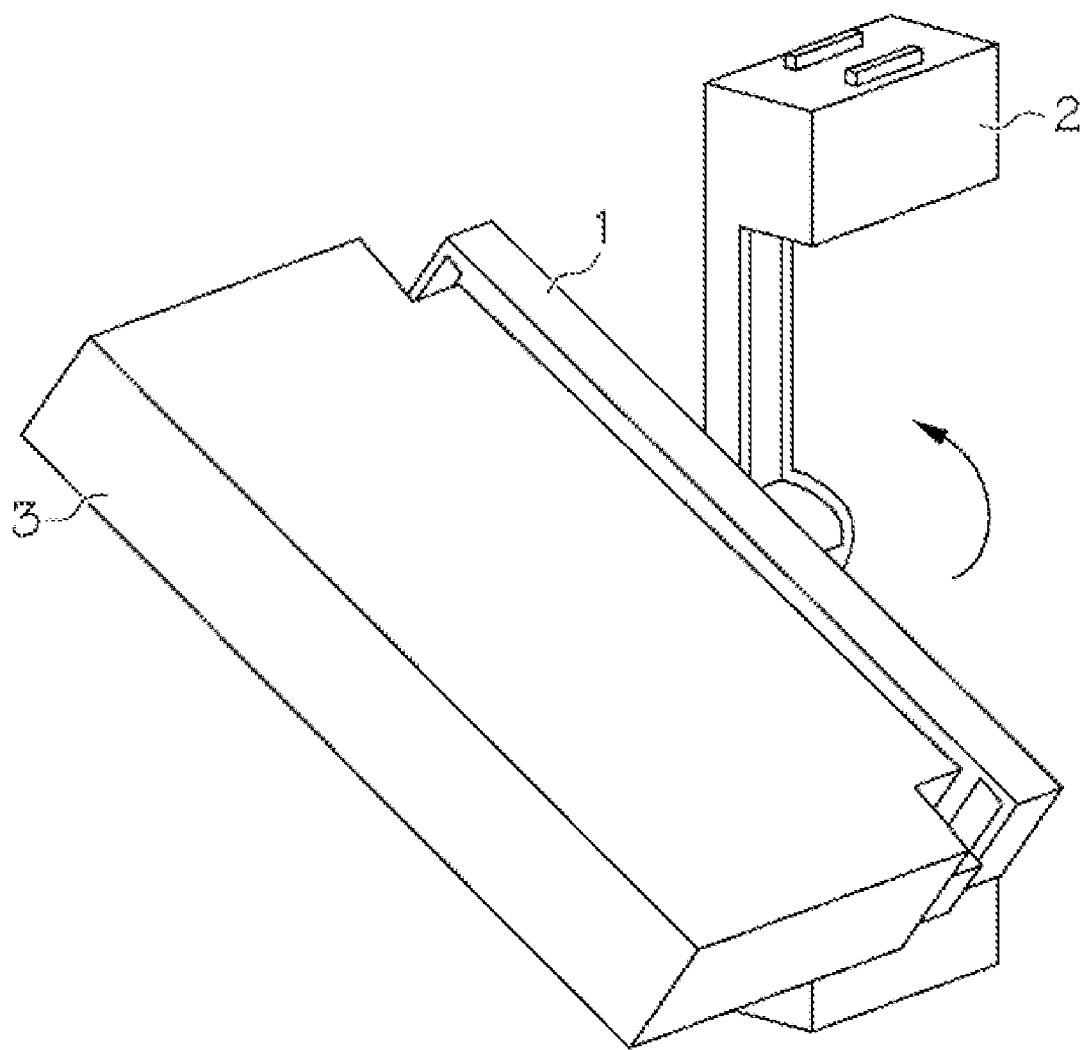
FIG. 8 is a perspective view of the control or information panel and hinge member unit selectively rotated to a selected vertical orientation of 45 degrees relative to the shuttle device according to the first embodiment of the present invention.

FIG. 8 illustrates a 45 degree orientation of the single unit hinge member 1 and information panel 3, when the unit is rotated about the central axis from the horizontal position relative to the shuttle device 2 about the central rotation axis of the openings 7a, 10a.

Figure 9:
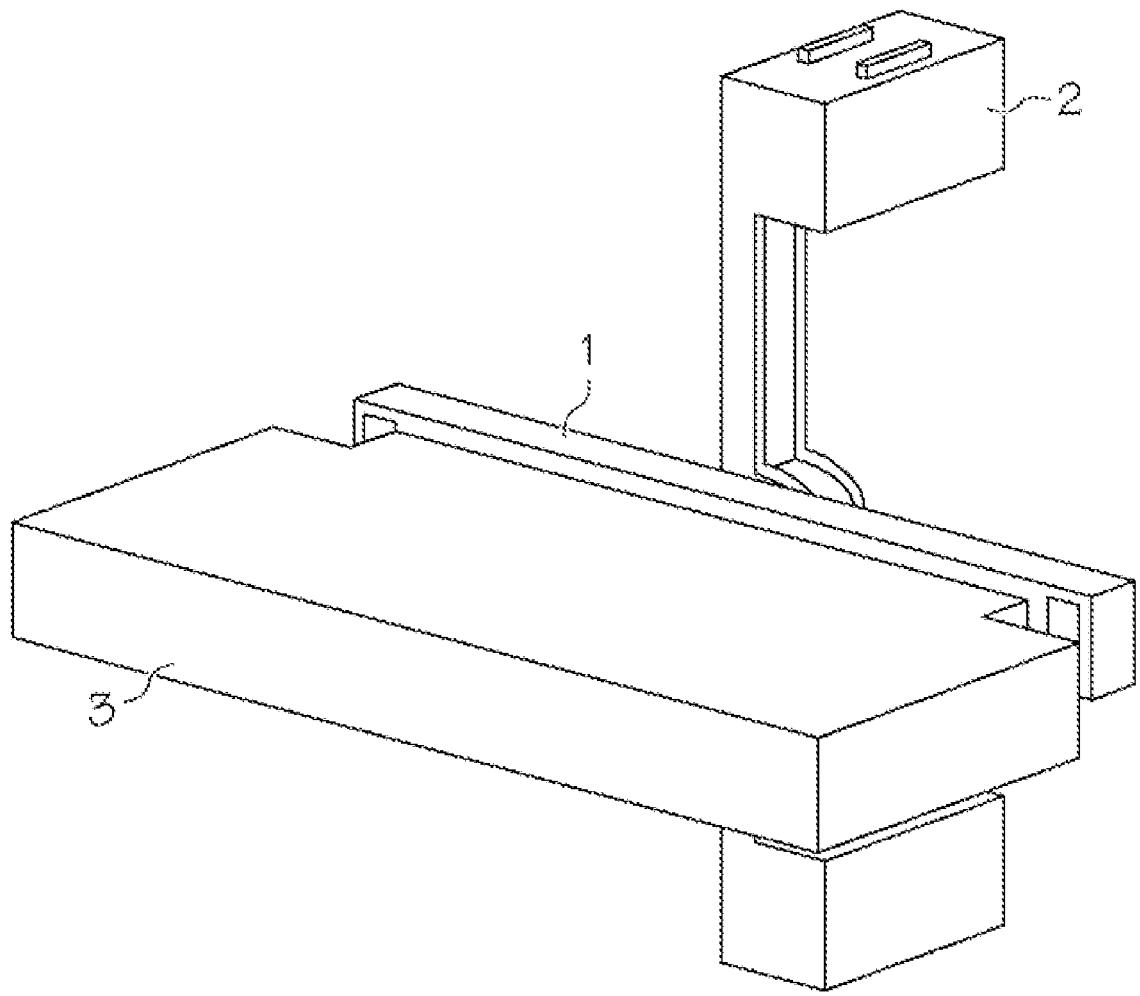
FIG. 9 is a perspective view of the control or information panel and hinge member unit selectively rotated to a selected vertical orientation of 90 degrees relative to the shuttle device according to the first and second embodiments of the present invention.
Figure 10:
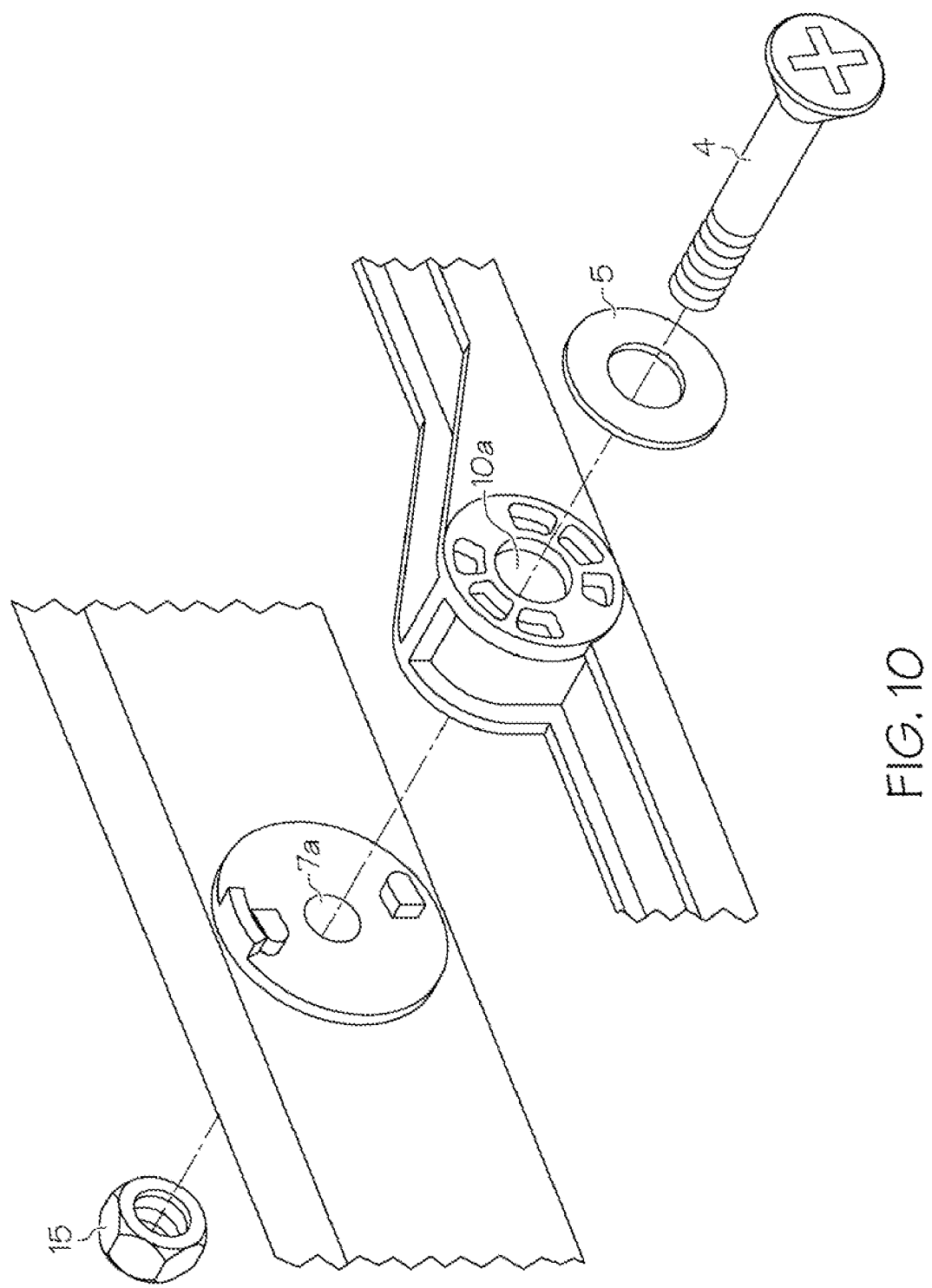
FIG. 10 illustrates a retaining or nut member inserted on an end of the shoulder screw opposite the head portion to secure the hinge member to the shuttle device.

FIG. 9 illustrates a 90 degree orientation of the single unit hinge member 1 and the information panel 3, when the unit is rotated about the central axis from the horizontal position relative to the shuttle device 2 about the central rotation axis of the openings 7a, 10a. This 90 degree rotation is applicable to both of the embodiments as shown in FIGS. 1-2 and FIGS. 6-9 of the present invention.

The operation of the FIGS. 1-9 as illustrated above will now be described in greater detail.

In the first embodiment as depicted in FIGS. 1-2, the screw member 4 extends through the first and second aligned openings, 7a, 10a of the central portion of the intermediate hinge member 1 and the central hub portion of the retracting and sliding tray or shuttle device 2. Disposed between the head of the screw-like member 4 and the hub portion of the shuttle device 2 is the cone-shaped washer 5 for rotatably securing the shuttle device 2 and the hinge member 1 together as a unit along a central axis of the aligned openings 7a, 10a. The end of the screw-like member opposite the head portion extends through the opening 10a of the hub portion and the opening 7a of the hinge member 1 and receives a nut or some other type of clamping means 15 on the side of the hinge member 1 opposite the tabs 7 and the stop member 6 for tightly securing the hinge member 1 and the shuttle device 2 together as a unit. This tight securement allows a user to pull at least on the hinge member 1 or the hinge member 1 and information panel 3 unit along the cone-shaped washer and slightly separate the hinge member 1 relative to the shuttle device 2 so that the hinge member 1 along with information panel 3 can be easily rotated to at least a pair of the three selected grooves 8-10 of the shuttle device 2. This selective rotation determines the horizontal viewing orientation position and the vertical viewing orientation positions at 45 degrees and 90 degrees as the hinge member 1 and the shuttle device 2 rotates as a single unit. This rotation allows the top face of the information panel 3 to be viewed at both horizontal and vertical orientation positions.

The hinge member 1 extends parallel along the rear face or side of the operator information panel 3 and substantially along the entire length thereof. On the intermediate portion of the intermediate hinge member 1, the at least a pair of selection tabs 7 project or extend from a surface thereof. The stop member 6 is positioned adjacent one of the selection tabs 7 and extending or projecting from a surface of the intermediate portion of the hinge member 1. The central portion of the shuttle device or slidable or retractable tray 2 about the central axis has the at least a pair of three selection notches or grooves 8-10 for matingly receiving the selection tabs 7 for permitting the information panel 3 and the hinge member 1 to be rotated as a single unit to selected horizontal and vertical orientations and text viewing positions. This orientation selection method is achieved manually by pulling on the single unit that includes the information panel 3 and hinge member 1 slightly away from the shuttle device or retractable tray 2 just enough to selectively rotate and allow the at least a pair of tabs to cam or ratchet themselves within the at least a pair of three selection notches or grooves for locking or latching the operator information panel 3 in plural selected orientations and text viewing positions. These selected orientations and text viewing positions are defined by 0 degrees, which is a horizontal position, and vertical positions of 45 degrees and 90 degrees. In the first embodiment, the stop member 6 provides added assurance that the intermediate hinge member 1 will travel a maximum distance of 90 degrees when the stop member 6 abuts a portion of the shuttle device or slidable or retractable tray 2 adjacent the hub portion 8a and the pair of tabs is moved to the pair of third selected grooves. This allows the text on the top face of the information panel to always be read at a correct and easy viewable orientation.

The operator information panel 3 is removeably secured to the hinge member by mechanical fastening means. Note that the information panel 3 can be secured by a sliding tight fit element or a snap-fitting element with a mating sliding tight fit element or snap-fitting element on the hinge member. Also, other types of mechanical fastening means, such as, bolts, pins, screws, rivets, clasps, etc., to name just a few can be utilized, if desired.

According to a second embodiment, which is the preferred invention as depicted in FIGS. 6-10, have the at least a pair of semi-circular grooves or notches 11 on the shuttle device or retractable tray 2 opposed to the at least a pair of three separate grooves 8-10 of the first embodiment. This embodiment defines a second manual orientation selection method that utilizes a moveable latch or switch member 12 that is moveable between latched and unlatched positions. A rotational coil spring 13 having an intermediate portion that is cooperatively secured about a hub portion defined by the central portion of the shuttle device or retractable tray 2, with a first end 13a cooperatively secured to another portion of the shuttle device or retractable tray 2 and a second end 13b cooperatively secured to a portion of the intermediate hinge member 1. Note that the coil spring could be fixedly or removeably secured to the hinge member 1 and the shuttle device 2. Preferably, the coil spring 13 is removeably secured to the hinge member 1 and the shuttle device 2. In the second embodiment, the screw 4 as depicted in the exploded view of FIG. 10 could be a hinge pin 16, as well as other mechanical fasteners, if desired.

The at least a pair of semi-circular grooves 11 having a depth that allows the at least a pair of the selection tabs 7 of the first embodiment to be received therein. These tabs 7 will abut one pair of ends of the at least pair of semi-circular grooves 11 when the information panel 3 and hinge member 1 is positioned parallel to the shuttle device 2 in a horizontal and latched position, and moved to a selected vertical position when the information panel 3 and hinge member 1 has been rotated 90 degrees together as a unit relative to the shuttle device 2 with the tabs 7 abutting the other pair of ends of the at least a pair of semi-circular grooves 11 upon the release of the compression of the coil spring 13 to an unlatched position. This 90 degrees rotation is a direct result of the latch or switch member 12 being moved out the slot or channel 14 of the hinge member 1 to the unlatched position and the slight separation movement of the hinge member 1 relative to the shuttle device 2 along the cone-shaped washer as discussed earlier.

The stop member 6 of the second embodiment is disposed outside of the at least one pair of the semi-circular grooves 11 and abuts a portion of the hub portion 8a when the information panel 3 is in a horizontal position and the stop 6 abuts another portion of the hub portion 8a when the information panel 3 is the vertical selected position. When the information panel 3 and hinge member 1 have been rotated 90 degrees to the vertical selected position due to the compression release of the coil spring 13 upon the unlatching of the latch or switch 12 from the channel 14, the tabs 7 abut the other ends of the at least a pair of semi-circular grooves 11, with the stop member 6 engaging another portion of the shuttle device 2 adjacent the hub portion 8a in the same manner as described in the first embodiment. In the second embodiment, the stop member 6 could be an optional feature. However, it is preferred to include the stop member 6 to provide added assurance that the intermediate hinge member 1 and the information panel 3 will only travel a maximum distance of 90 degrees when the stop 6 abuts the another portion adjacent the hub portion 8a of the shuttle device or slidable retractable tray 2, upon the release of the compression of the coil spring 13. This allows the text on the top face of the information panel 3 to always be read at a correct vertical orientation when the latch or switch 12 is moved out of the latch channel 14.

In conclusion, since the structure is a simple arrangement, the single unit information panel 3 and universal hinge 1 can easily be mounted in either horizontal or vertical orientations while being rotated about a common axis. The advantage is that it opens up more possibilities for integrating a single control panel design into more products and thus eliminating cost of development for multiple subassemblies for different information panel orientations.

The foregoing descriptions of the specific embodiments of FIGS. 1-10 have been presented for purposes of illustration and description. They are not intended to be exhaustive or to limit the present invention to the precise forms disclosed, and obviously many modifications and variations are possible in the light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined as set forth in the following claim(s).

What is claimed is:

1. An operator information panel and a universal hinge member connected together as a single unit to a slidable shuttle device mounted for use with a processor-based device, comprising:
    a shuttle device slidable between retracted and extended display positions from within a server system;
    the shuttle device with a central hub portion with first opening therein;
    a universal hinge member with a central intermediate portion with a second opening therein;
    the central hub portion with at least a pair of plural selective detent grooves thereon;
    the universal hinge member with at least a pair of spaced apart tabs above and below the second opening;
    at least a stop member positioned outwardly of and adjacent to the at least one of the pair of spaced apart tabs;
    a shoulder screw member with a head portion and a cone-shaped washer disposed thereon and below the head portion;
    the screw member being inserted through the first and second openings with an end portion opposite the head portion for receiving a retaining member for securing the shuttle device to the hinge member and information panel unit, the hinge member is disposed parallel and substantially along the entire length of a surface of the shuttle device in a horizontal orientation position; and
    a releasable latch means disposed between the universal hinge member and the shuttle device, wherein the hinge member and the information panel is able to be rotated as single unit relative to the shuttle device to selective plural horizontal and vertical positions along a central rotational axis about the first and second openings, the releasing of the locking means allows the at least a pair of spaced apart tabs to be selective rotated along the at least a pair of plural selective detent grooves to orient a top face of the information panel to be able to viewed in both the horizontal and the vertical positions as the single unit is rotated about the rotational axis relative to shuttle device, and the selective horizontal and vertical positions extend within a range between 0 degrees and 90 degrees due to the selective rotational position of the stop member.

* * * * *